United States Patent [19]
Fujioka et al.

[11] Patent Number: 5,382,531
[45] Date of Patent: Jan. 17, 1995

[54] METHOD FOR CONTINUOUSLY MANUFACTURING A SEMICONDUCTOR DEVICE

[75] Inventors: Yasushi Fujioka, Hikone; Takashi Kurokawa, Kawasaki; Masahiro Kanai, Hikone; Masafumi Sano, Nagahama; Takehito Yoshino, Nagahama; Yuzo Kohda, Nagahama, all of Japan

[73] Assignee: Canon Kabushiki Kaisha, Tokyo, Japan

[21] Appl. No.: 97,046

[22] Filed: Jul. 27, 1993

Related U.S. Application Data

[62] Division of Ser. No. 858,410, Mar. 27, 1992, Pat. No. 5,266,116.

[30] Foreign Application Priority Data

Mar. 28, 1991 [JP] Japan .................... 3-087420

[51] Int. Cl.⁶ .............. H01L 31/18; H01L 31/04; C23C 16/50; C23C 16/54
[52] U.S. Cl. ........................ 437/2; 437/101; 437/926
[58] Field of Search .............. 437/101, 2, 926; 118/718, 719, 723 E, 723 MW; 136/258

[56] References Cited

U.S. PATENT DOCUMENTS

| | | | |
|---|---|---|---|
| 4,400,409 | 8/1983 | Izu et al. | 427/39 |
| 4,438,724 | 3/1984 | Doehler et al. | 118/719 |
| 4,450,786 | 5/1984 | Doehler et al. | 118/723 X |
| 4,462,332 | 7/1984 | Nath et al. | 118/718 |
| 4,664,951 | 5/1987 | Doehler | 118/718 X |
| 4,763,601 | 8/1988 | Saida et al. | 118/718 |
| 4,951,602 | 8/1990 | Kanai | 118/719 |

Primary Examiner—Nam Nguyen
Assistant Examiner—Jonathan D. Baskin
Attorney, Agent, or Firm—Fitzpatrick, Cella, Harper & Scinto

[57] ABSTRACT

An apparatus continuously manufactures a semiconductor device. A plurality of glow discharge regions are connected by gas gates. An enough long belt-shaped substrate having a desired width is arranged along a path in which the substrate sequentially penetrates the glow discharge regions. The belt-shaped substrate is continuously conveyed in a longitudinal direction while depositing a semiconductor layer of a conductivity type which is needed in each of the glow discharge regions, thereby continuously manufacturing the device having a semiconductor junction. A plurality of rotatable rollers are arranged in a slit-shaped separating passage of the gas gates so as to support the back surface of the belt-shaped substrate while rotating the rollers.

7 Claims, 11 Drawing Sheets

ALONG A-A'

ALONG B-B'

ALONG C-C'

ALONG A-A'

ALONG B-B'

ALONG C-C'

METHOD FOR CONTINUOUSLY MANUFACTURING A SEMICONDUCTOR DEVICE

This application is a division of application Ser. No. 07/858,410 filed Mar. 27, 1992, U.S. Pat. No. 5,266,116.

BACKGROUND OF THE INVENTION

1. Field of the Invention

The invention relates to an apparatus which can continuously manufacture a semiconductor device of a large area, particularly, a laminated semiconductor thin film device such as a photoelectromotive device or the like onto a substrate and also relates to a manufacturing method using such an apparatus.

2. Related Background Art

Hitherto, as a method of continuously manufacturing a semiconductor device such as a photoelectromotive device or the like onto a substrate, there has been proposed a method whereby an independent film forming chamber to form layers of the semiconductor device is provided and each of the semiconductor layers is formed in the film forming chamber.

For instance, a continuous plasma CVD method using the Roll to Roll system is disclosed in the specification of U.S. Pat. No. 4,400,409. According to such a method, a plurality of glow discharge regions are provided, a sufficiently long belt-shaped substrate of a desired width is arranged along a path in which the substrate sequentially penetrates the glow discharge regions, the substrate is continuously conveyed in the longitudinal direction while depositing semiconductor regions of the conductivity type which are needed in the glow discharge regions, so that a device having a semiconductor junction can be continuously manufactured.

In the specification, a gas gate is used to prevent a film forming gas, which is used upon formation of each semiconductor layer, namely, a dopant gas, from being diffused and mixed into the other glow discharge regions.

Practically speaking, a means is used such that the glow discharge regions are separated by slit-shaped separating passages, a flow of a gas for scavenging such as Ar, $H_2$, or the like is further formed on the separating passages or exhaust means is provided on the separating passages, and the gases flowing into from the adjacent film forming chambers are exhausted.

Further, in the specification of U.S. Pat. No. 4,462,332, a method is disclosed whereby a belt-shaped substrate of a magnetic material comes into pressure contact with one of the wall surfaces of the gas gate by a magnetic force and the belt-shaped substrate is conveyed in side contact with the wall surface. According to such a method, since the substrate position in the gas gate is stable, an interval between the substrate surface and the wall surface of the gas gate can be sufficiently narrowed and since the back surface of the substrate is adhered to the gas gate wall, an excellent separating performance of the gas between the adjacent discharge regions is obtained.

FIG. 8 is a diagram of the gas gate shown in the above patent specification. FIG. 9 shows a diagram of a gas gate in which the substrate does not come into contact with the wall surface of the gas gate. In the diagrams, reference numerals 801 and 901 denote slit-shaped separating passages; 803 and 903 gas gate walls; 804 and 904 belt-shaped substrates; 805 and 905 gas introducing pipes for scavenging; and 806 a magnet.

According to the above method, however, since the belt-shaped substrate is conveyed in slide contact with the wall surface of the gas gate, a frictional force at the gas gate easily increases as compared with the method whereby the substrate is conveyed while keeping a gap between the substrate and the gas gate wall surface. When the frictional force increases, scratches are formed on the back surface of the belt-shaped substrate and a pressure is applied from the substrate side to the deposited film. On the other hand, a tension upon conveyance of the belt-shaped substrate increases and a pressure is applied from the front surface side of the substrate to the deposited film when the belt-shaped substrate after completion of the film deposition is wound up, so that a number of defects of the semiconductor device are generated.

In the case where a thin material or a material which can be easily extended is used as a belt-shaped substrate, when the frictional force at the gas gate increases, the substrate is extended or wrinkles occur due to an increase in tension upon conveyance of the belt-shaped substrate. Consequently, a peel-off, cracks, or the like of the deposited film occur and defects easily occur in the semiconductor device.

Therefore, as shown in the specification of U.S. Pat. No. 4,462,332, a material of a low frictional force is used in a contact portion of the gas gate, or as shown in the specification of U.S. Pat. No. 4,438,724, a long groove is provided in the contact portion of the gas gate in the progressing direction of the belt-shaped substrate and a contact area between the belt-shaped substrate and the gas gate wall surface is reduced or the like, thereby decreasing the frictional force.

According to the above conventional methods, since it is impossible to sufficiently reduce the frictional force while keeping the adhering state between the belt-shaped substrate and the gas gate wall surface, a strong pressure is certainly applied to the deposited film and defects frequently occur in the semiconductor device. To convey the belt-shaped substrate, a strong tension is surely needed, so that a peel-off or cracks of the deposited film easily occur. A thin material or a material which can be easily extended cannot be used as a substrate material. There is a limitation in the material which is used as a substrate.

Particularly, in the case of a tandem type solar battery or the like having a large number of layers to be deposited, the number of gas gates which the belt-shaped substrate penetrates in the manufacturing steps of a semiconductor device is large and the frictional force also increases in accordance with an increase in number of gas gates, so that there are large influences such as deterioration of productivity due to the occurrence of defects, limitation of the substrate material, and the like.

SUMMARY OF THE INVENTION

It is an object of the invention to solve the problems of the conventional apparatus for continuously manufacturing the semiconductor device of the Roll to Roll system and also to provide an apparatus for continuously manufacturing a semiconductor device in which a frictional force of a belt-shaped substrate at a gas gate is remarkably reduced while effectively preventing the mutual mixture of gases into adjacent film forming chambers, and the occurrence of defects of the semiconductor device due to a pressure which is applied to a deposited film is eliminated.

Another object of the invention is to provide an apparatus for continuously manufacturing a semiconductor thin film having a wide application range of a substrate material, in which a tension upon conveyance of a substrate is reduced while effectively preventing the mutual mixture of gases into adjacent film forming chambers, and even a thin material or a material which can be easily extended can be used as a substrate material.

BRIEF DESCRIPTION OF THE DRAWINGS

FIGS. 4(A) to 4(C) show an example of cross sectional views of the gas gate shown in FIG. 3, in which FIG. 4(A) is a cross sectional view taken along the the line A—A' in FIG. 3, FIG. 4(B) is a cross sectional view taken along the line B—B' in FIG. 3, and FIG. 4(C) is a cross sectional view taken along the line C—C' in FIG. 3;

FIGS. 5(A) to 5(C) show another example of cross sectional views of the gas gate shown in FIG. 3, in which FIG. 5(A) is a cross sectional view taken along the line A—A' in FIG. 3, FIG. 5(B) is a cross sectional view taken along the line B—B∝ in FIG. 3, and FIG. 5(C) is a cross sectional view taken along the line C—C' in FIG. 3;

FIGS. 7(A) to 7(C) show an example of cross sectional views of the gas gate shown in FIG. 6, in which FIG. 7(A) is a cross sectional view taken along the line A—A' in FIG. 6, FIG. 7(B) is a cross sectional view taken along the line B—B' in FIG. 6, and FIG. 7(C) is a cross sectional view taken along the line C—C' in FIG. 6;

DETAILED DESCRIPTION OF THE PREFERRED EMBODIMENTS

Figure 1:
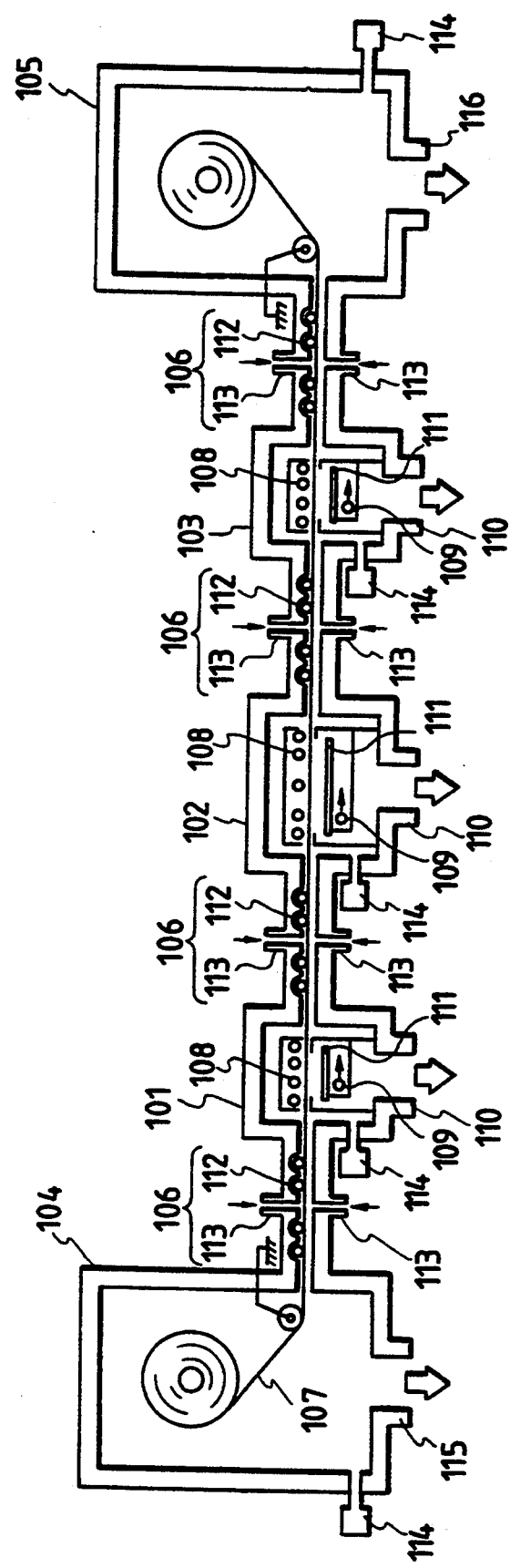
FIG. 1 is a schematic diagram showing an example of an apparatus for continuously manufacturing a semiconductor device of the present invention.

A preferred embodiment of an apparatus for manufacturing a semiconductor device of the invention will now be described hereinbelow.

That is, an apparatus for continuously manufacturing a semiconductor device according to the present invention is constructed in the following manner. A plurality of glow discharge regions are connected by gas gates. A sufficiently long belt-shaped substrate having a desired width is arranged along a path in which the substrate sequentially penetrates the glow discharge regions. The belt-shaped substrate is continuously conveyed in the longitudinal direction of the substrate while depositing semiconductor layers of the conductivity type which are needed in the glow discharge regions, thereby continuously forming the device having a semiconductor junction. A plurality of rotatable rollers are supported into slit-shaped separating passages of the gas gates while rotating the back surface of the belt-shaped substrate (surface of the substrate on the side on which no semiconductor layer is deposited).

A preferred embodiment of a method of manufacturing a semiconductor device according to the invention will now be described hereinbelow.

That is, there is provided a method of continuously manufacturing a semiconductor device by using the foregoing apparatus of manufacturing the semiconductor device of the invention, whereby a variation width of the magnetic force exerted on the portions between rollers and the belt-shaped substrate upon conveyance of the belt-shaped substrate is set to a value which is less than ½ of the maximum value of the magnetic force.

According to the continuous manufacturing apparatus of the invention having a plurality of rollers in the slit-shaped separating passages of gas gates in the Roll to Roll type manufacturing apparatus, it is possible to realize an apparatus for continuously manufacturing a semiconductor device in which a frictional force of the belt-shaped substrate in the gas gates is remarkably reduced while effectively preventing the mutual mixture of gases into adjacent film forming chambers and the occurrence of defects of the semiconductor device due to a pressure which is applied to a deposited film is eliminated.

On the other hand, according to the apparatus of the invention, it is possible to realize an apparatus for continuously manufacturing a semiconductor thin film having a wide application range of a substrate material such that tension upon conveyance of a substrate is reduced while effectively preventing the mutual mixture of gases into adjacent film forming chambers and even a thin material or a material which can be easily extended can be used as a substrate material.

The invention will now be described in detail hereinbelow.

In a Roll to Roll type apparatus for continuously manufacturing a semiconductor device, a plurality of glow discharge regions are connected by gas gates. A belt-shaped substrate is arranged along a path in which the substrate sequentially penetrates the glow discharge regions, and is continuously conveyed in the longitudinal direction of the substrate while depositing and forming a desired semiconductor layer in each glow discharge region, thereby continuously manufacturing a device having a semiconductor junction. A manufacturing apparatus of a semiconductor device according to the invention is constructed in a manner such that by arranging a plurality of rotatable rollers into slit-shaped separating passages of the gas gates, the belt-shaped substrate is stably supported from the back surface in contact state. An interval between the substrate surface and the gas gate wall surface is held to a sufficiently narrow constant interval. The mutual mixture of gases is prevented. A contact surface between the substrate back surface and the roller is rotated in association with the conveyance of the substrate while keeping an adhering state, and a frictional force and a tension which are applied to the belt-shaped substrate are reduced.

FIG. 1 is a diagram showing an example of a continuous manufacturing apparatus of a semiconductor device according to the invention. In FIG. 1, reference numerals 101, 102, and 103 denote film forming chambers according to a high frequency plasma CVD method; 104 a supply chamber of a belt-shaped substrate; and 105 a take-up chamber of the belt-shaped substrate. The film forming chambers are connected by gas gates 106. Reference numeral 107 denotes a belt-shaped substrate. The substrate 107 passes through three film forming chambers for a period of time during which the substrate is fed out from the supply chamber 104 and is conveyed into the take-up chamber 105. Three deposited films, for instance, semiconductor layers having a PIN structure for a solar battery are formed on the surface of the substrate.

In each of the film forming chambers 101 to 103, there are provided a heater 108 to heat the substrate, a gas introducing pipe 109 to introduce a film forming gas which is supplied from gas supplying means (not shown) into the film forming chamber, an exhaust pipe 110 to exhaust the inside of the film forming chamber by exhausting means (not shown), and a discharge electrode 111 for supplying a high frequency electric power such as to cause a discharge by giving an energy to the film forming gas in the film forming chamber. A film deposition is executed by the high frequency plasma CVD method, respectively.

A rotatable roller 112 is provided for the gas gate 106 and the belt-shaped substrate is supported from the back surface in a contact state. Scavenging gases are introduced from upper and lower scavenging gas introducing pipes 113. A flow of the scavenging gas is formed in the slit-shaped separating passage of the gas gate, thereby blocking the mixture of the film forming gases into the adjacent film forming chambers. Reference numeral 114 denotes a pressure gauge. Reference numerals 115 and 116 denote exhaust pipes to exhaust the supply chamber and the take-up chamber.

Figure 2:
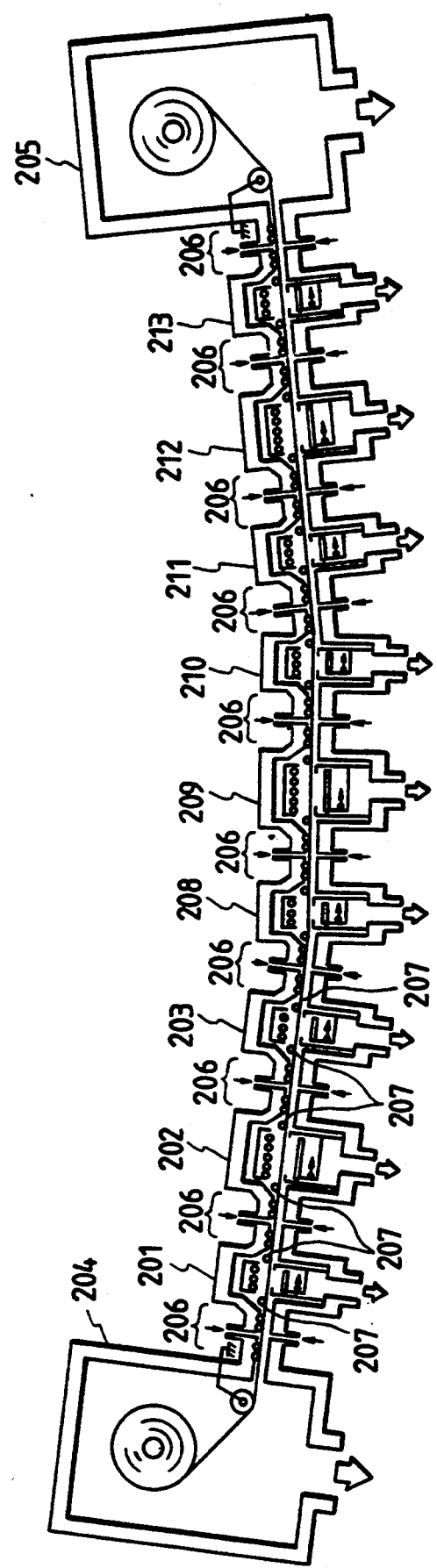
FIG. 2 is a schematic diagram showing another example of an apparatus for continuously manufacturing a semiconductor device of the invention.

FIG. 2 shows another example of a continuous manufacturing apparatus of a semiconductor device according to the invention. The apparatus shown in FIG. 2 is fundamentally constructed by further serially adding six film forming chambers and six gas gates to the apparatus shown in FIG. 1. Component elements shown by reference numerals 201 to 206 in FIG. 2 correspond to those shown by reference numerals 101 to 106 in FIG. 1.

In the apparatus, each film forming chamber is arranged in accordance with the shape of the belt-shaped substrate which hangs down by the dead weight. Rotatable supporting rollers 207 to support the belt-shaped substrate from the back surface are arranged near an entrance and an exit of the film forming chamber so that the belt-shaped substrate is horizontally located in the film forming chamber.

Reference numerals 208 to 210 and 211 to 213 denote film forming chambers according to the high frequency plasma CVD method similar to the film forming chambers 201 to 203.

According to the apparatus, deposited films comprising nine layers, for instance, semiconductor layers for a tandem type solar battery having a PIN/PIN/PIN structure can be formed onto the substrate by the high frequency plasma CVD method.

The gas gate will now be further described hereinbelow. It is preferable that the roller in the invention has a cylindrical shape. It is desirable to arrange the roller at a position such that the roller surface is slightly (about 0.1 to 5 mm) projected from the gas gate wall surface on the back side of the belt-shaped substrate of the slit-shaped separating passage of the gas gate in such directions that the rotary axis of the roller is perpendicular to the conveying direction of the belt-shaped substrate and is almost horizontal to the gas gate wall surface. An interval (slit width) of the slit-shaped separating passage is ordinarily set to about 1 to 10 mm.

It is preferable to provide a sufficient number of rollers such that the belt-shaped substrate is supported and can be smoothly conveyed. Therefore, the number of rollers is properly set in accordance with the size, weight, and material of the substrate, the structure of the gas gate, and the like. In general, it is sufficient to arrange the rollers at a ratio of about 5 to 50 columns/m in the conveying direction. Although a diameter of each roller is not specified, it is ordinarily set to about 5 to 50 min.

Figure 3:
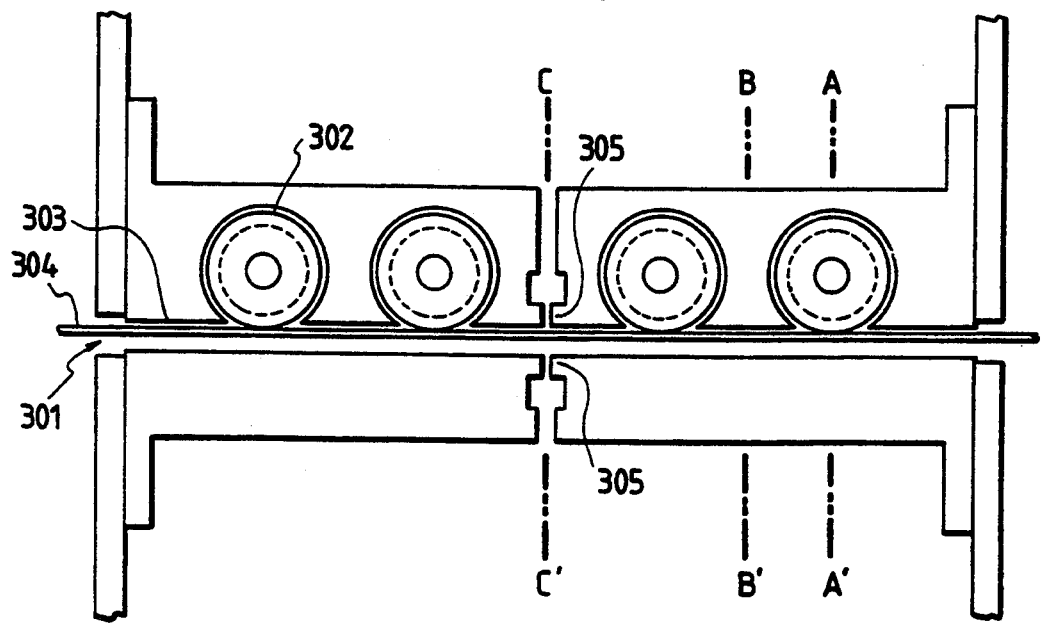
FIG. 3 is a schematic diagram showing an example of a structure of a gas gate in the invention.

FIG. 3 is a diagram showing an example of a gas gate of the manufacturing apparatus of the invention. Rotatable rollers 302 are arranged in a slit-shaped separating passage 301 in such a manner that the cylindrical surface of the roller is slightly projected from a gas gate wall surface 303, thereby supporting the back surface of a belt-shaped substrate 304. Reference numeral 305 denotes a scavenging gas introducing pipe.

The material of the roller in the invention, can be a material in which thermal deformation and abrasion are small even when the roller comes into contact for a long time with the belt-shaped substrate that has been heated to a temperature suitable for film formation. As such a material, metal such as stainless steel or the like, ceramics such as alumina or the like, glass such as quartz or the like, a compound material of them, and the like can be used. As to the shape of the roller, the surface fundamentally has a cylindrical shape. However, a groove can be also formed in the circumferential direction of the roller in order to stabilize the flow of the gas at the back surface of the substrate.

In order to raise an adhesive property between the substrate and the roller and to make it difficult for the substrate to float upward from the roller even when there is a slight wave-like or warped state of the substrate, it is an effective way to use a belt-shaped substrate made of a ferromagnetic material such as one made by SUS430BA Steel or the like, and to arrange a magnet on the inside of the roller or on the backside of the roller to allow the substrate to come into pressure contact with the roller by magnetic force. Although the magnetic force of the magnet is properly set in accordance with the kind, weight, and the like of the substrate, the object can be accomplished by the magnetic force of, e.g., 100 to 1000 Gauss at the position of the substrate.

Figure 6:
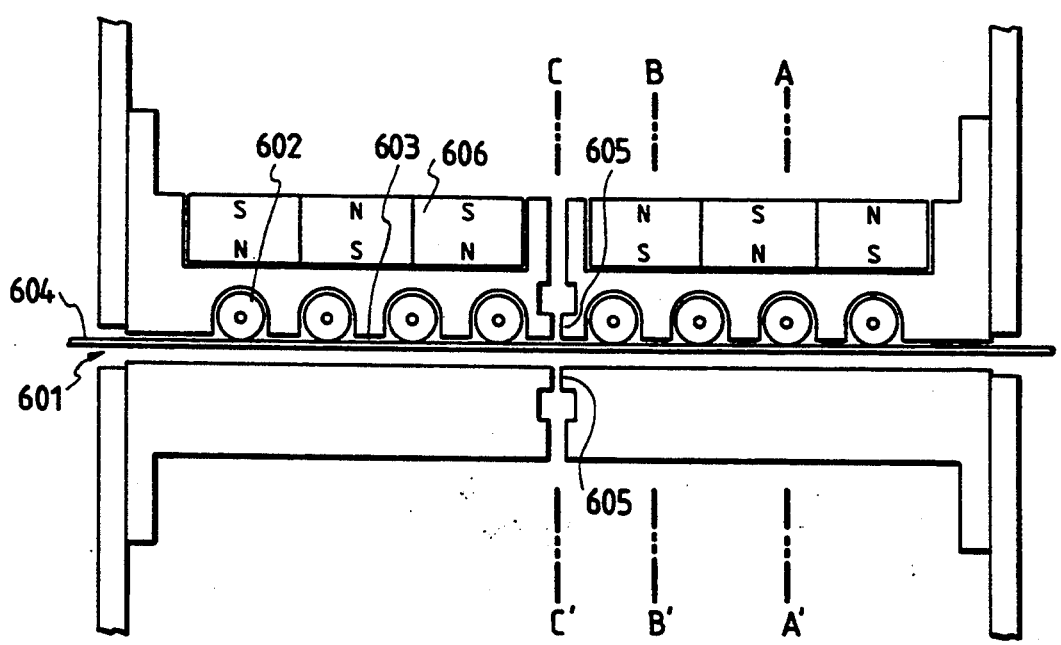
FIG. 6 is a schematic diagram showing another example of a structure of a gas gate in the invention.
Figure 4A:
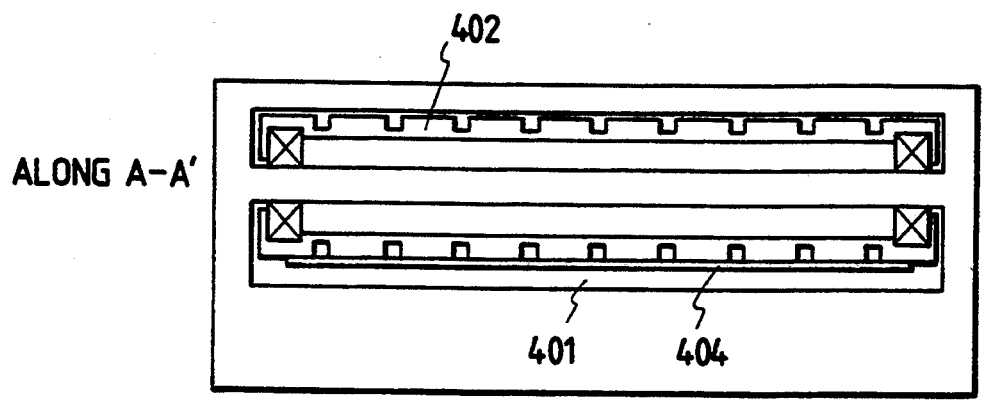
Figure 4B:
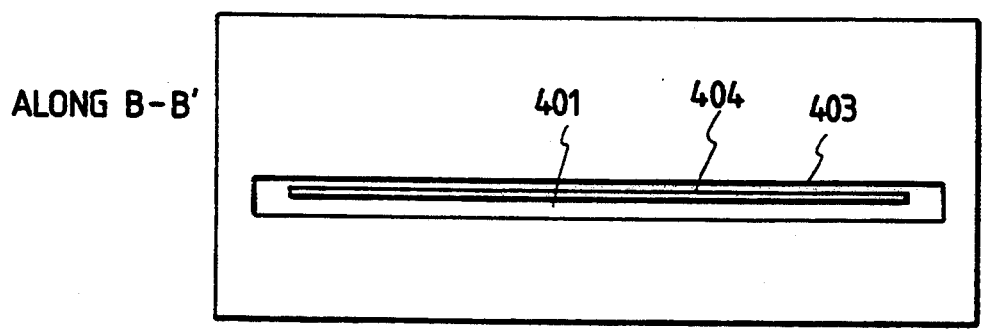
Figure 4C:
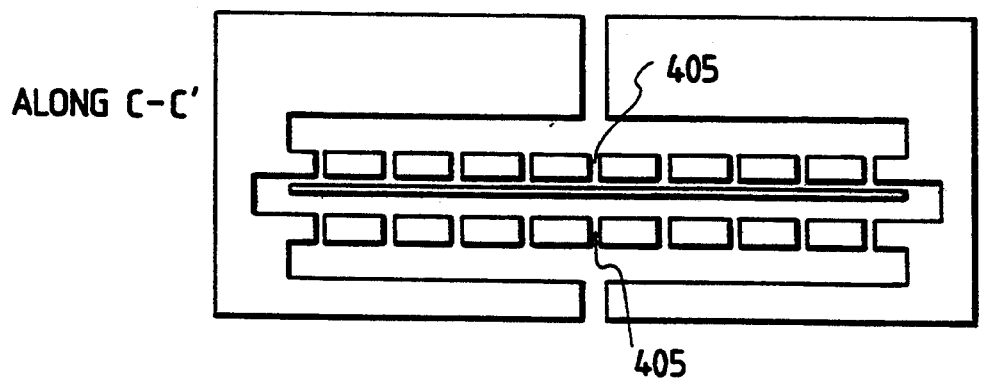
Figure 5A:
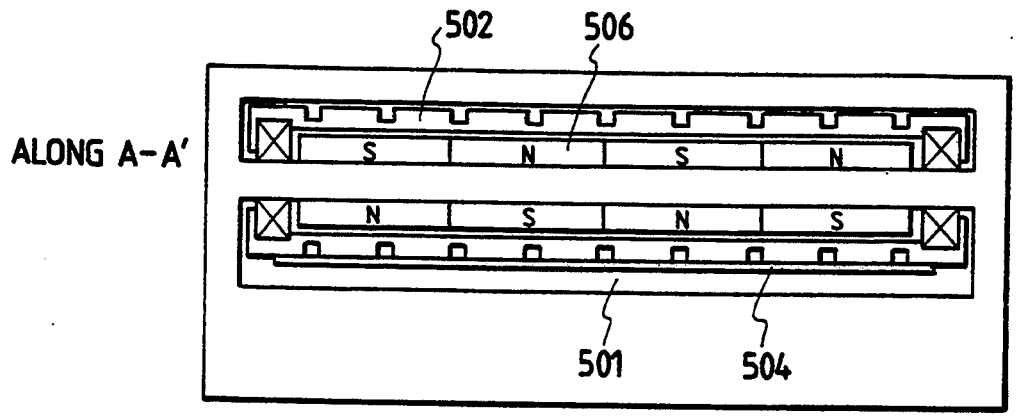
Figure 5B:
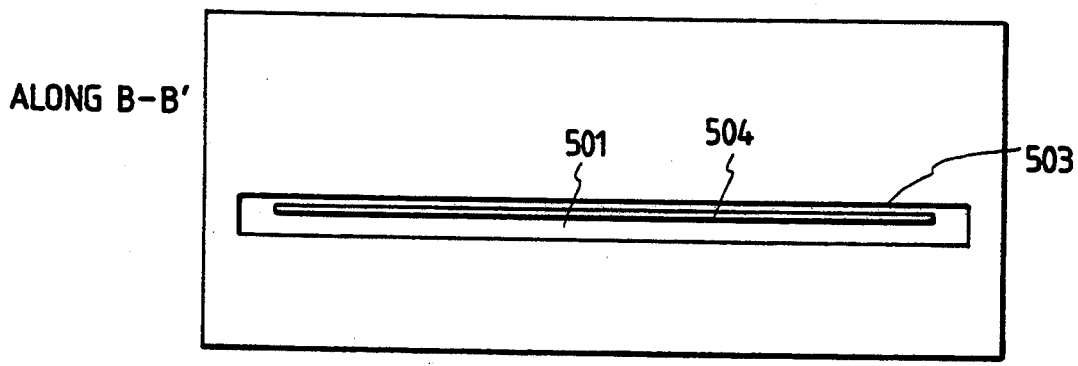
Figure 5C:
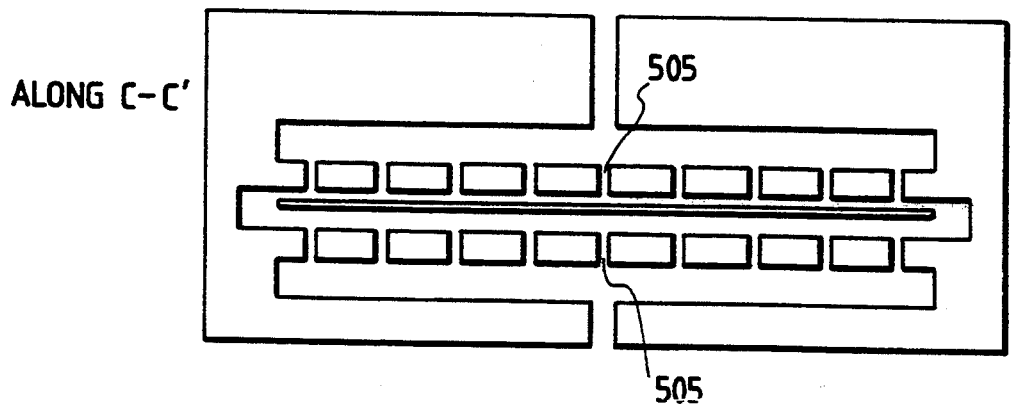
Figure 7A:
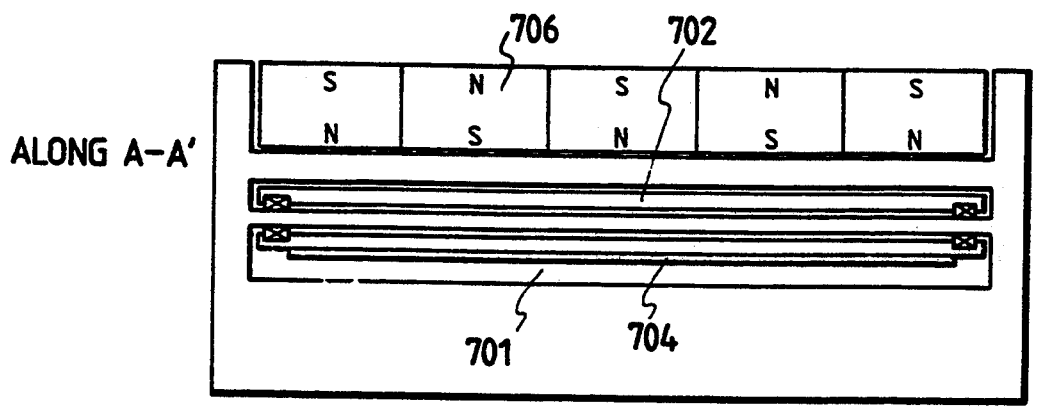
Figure 7B:
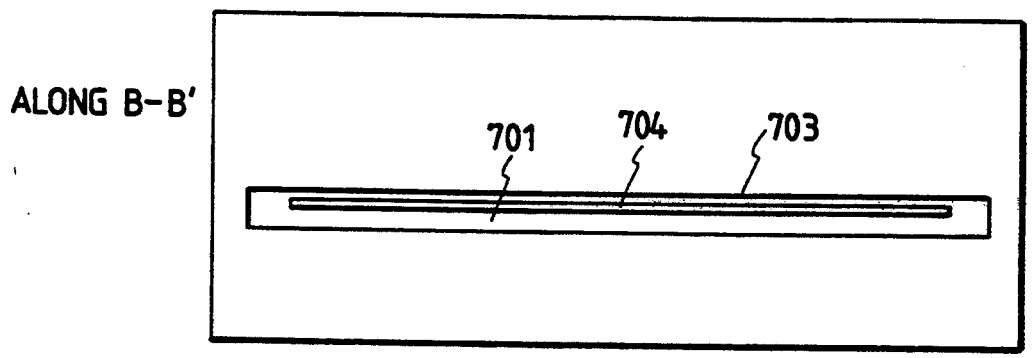
Figure 7C:
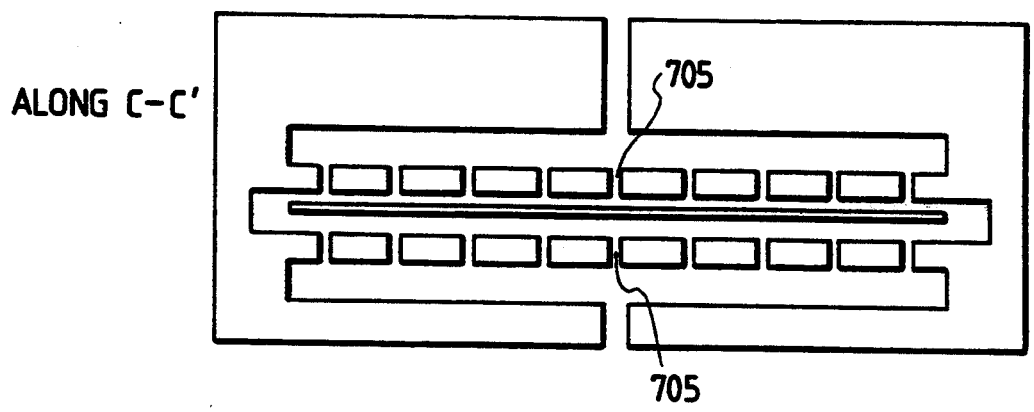

FIGS. 4(A) to 4(C) are cross sectional views in the case where the magnet of the gas gate in the apparatus of the invention shown in FIG. 3 is not used. FIGS. 5(A) to 5(C) are cross sectional views in the case where a magnet is provided in the roller of the gas gate of the apparatus of the invention shown in FIG. 3. FIG. 6 is a schematic side elevational view showing an example of a gas gate of the apparatus of the invention in the case where a magnet is provided on the back side of the roller. FIGS. 7(A) to 7(C) are cross sectional views of the gas gate of FIG. 6.

In the diagrams, reference numerals 401, 501, 601 and 701 denote gas separating passages; 402, 502, 602 and 702 rollers; 403, 503, 603 and 703 gas gate wall surfaces; 404, 504, 604 and 704 belt-shaped substrates; 405, 505, 605 and 705 scavenging gas introducing pipes; and 506, 606 and 706 magnets.

Figure 8:
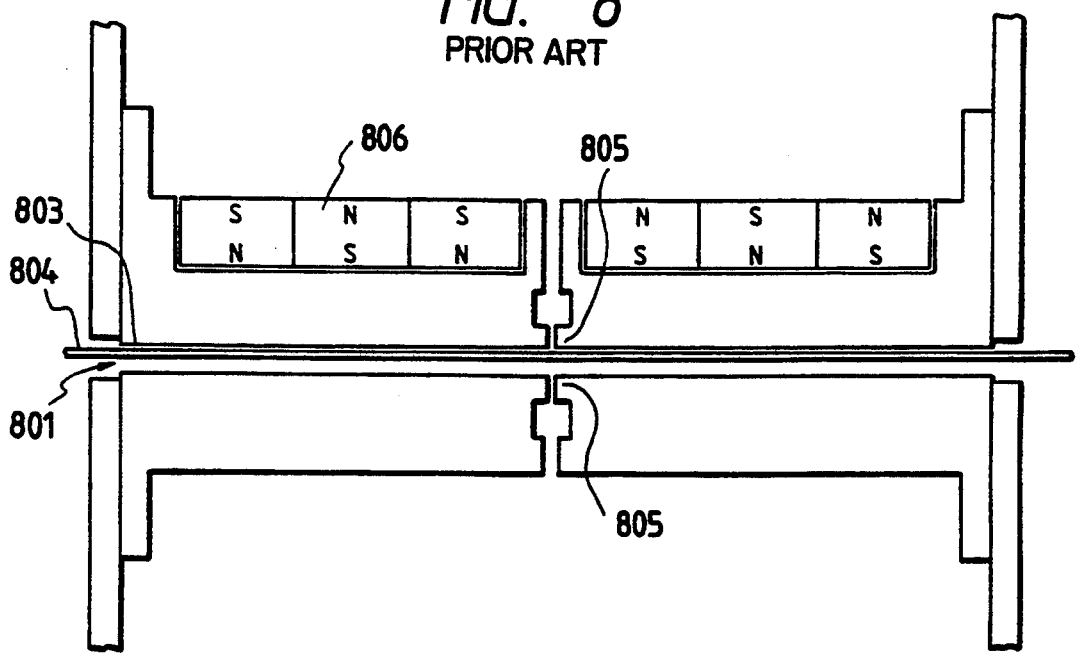
FIG. 8 is a schematic diagram showing a structure of a conventional gas gate.
Figure 9:
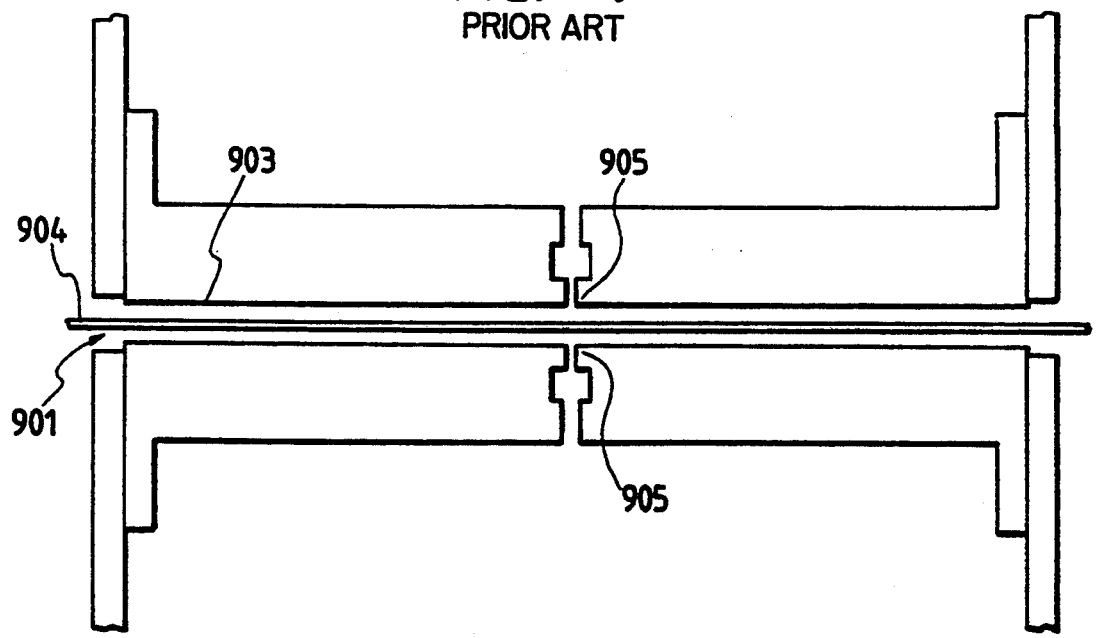
FIG. 9 is a schematic diagram showing another structure of a conventional gas gate.

The gas gate of the apparatus of the invention shown in FIG. 6 and a conventional gas gate shown in FIG. 8 have substantially the same structure except a point regarding the presence or absence of the rotatable rollers. Magnetic forces exerted on the substrates in the gas gates of FIGS. 6 and 8 are also almost equal.

Figure 10A:
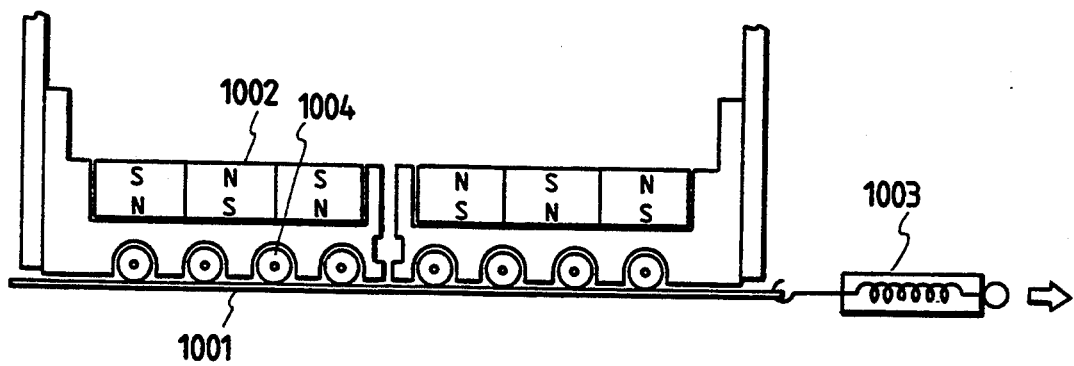
FIGS. 10(A) and 10(B) are schematic diagrams showing methods of measuring a magnetic force and a frictional force which are exerted on a substrate in a gas gate.
Figure 10B:
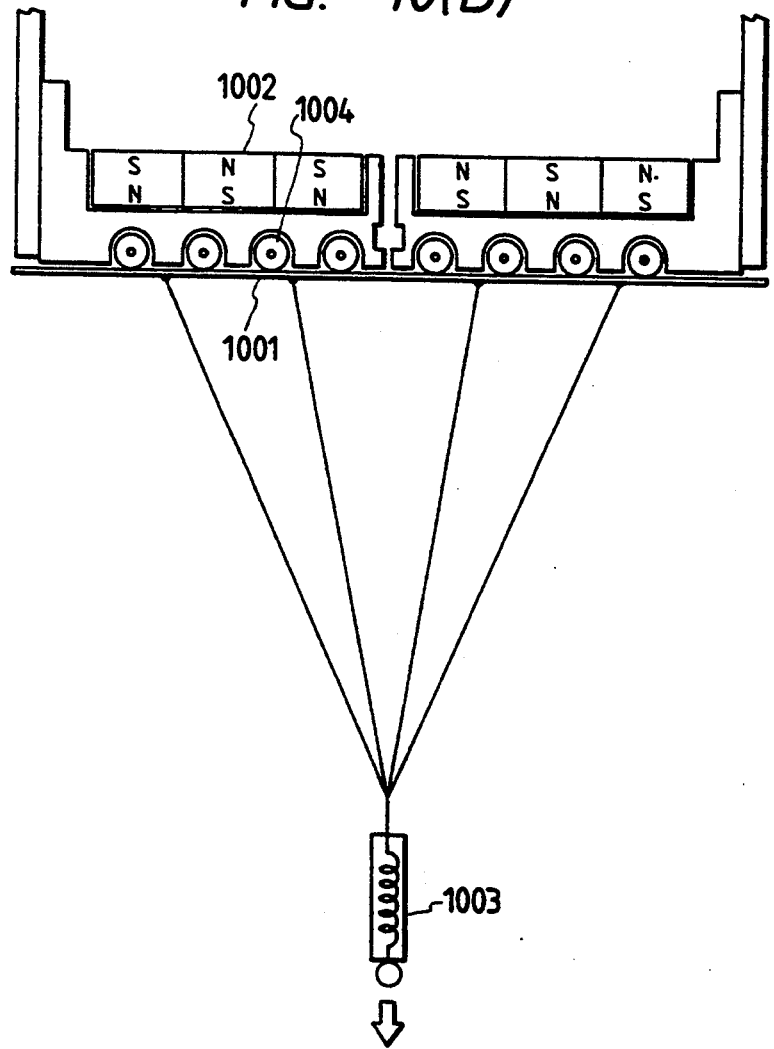
Figure 11:
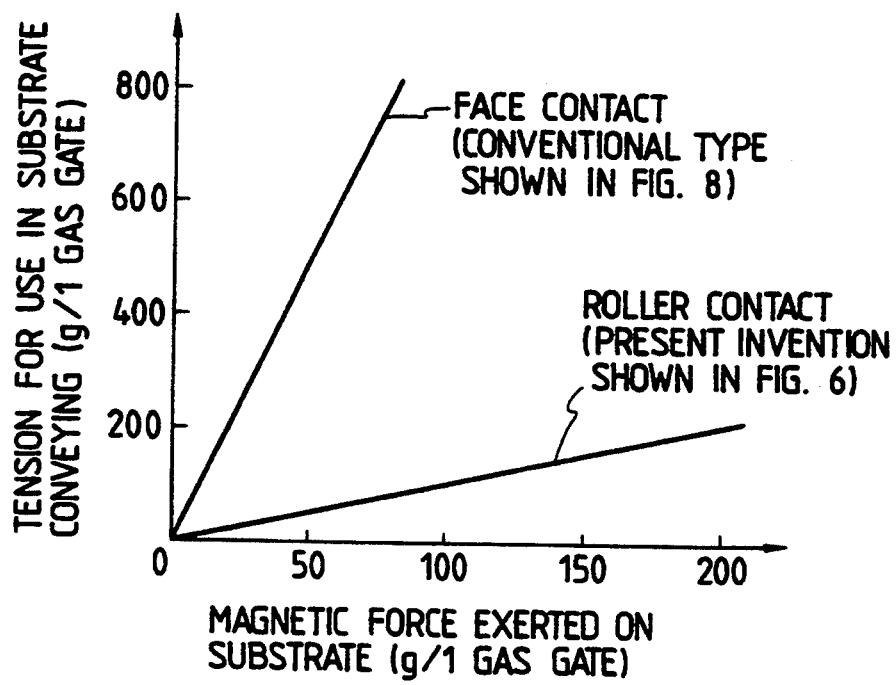
FIG. 11 is a graph showing the results of the measurement of the performance of a gas gate according to the invention and the performance of a conventional gas gate and also shows the relation between the magnetic force exerted on the substrate and the tension which is required for conveyance of the substrate.

FIG. 11 shows an example of the results of the measurement of the tensions which are required for conveyance of the substrate which are obtained by changing the magnetic forces exerted on the substrate by changing the number of magnets in each of the gas gates of FIGS. 6 and 8. The magnetic force exerted on the substrate and the tension required for conveyance of the substrate were measured by a spring balancer 1003 by allowing a substrate 1001 to come into contact with rollers 1004 in the upper half portion of the gas gate as shown in FIG. 10(A) to 10(B) and by changing the magnetic force by changing the number of magnets 1002. It has been confirmed from FIG. 11 that the frictional force of the substrate can be remarkably reduced to about 1/10 by using the rollers at the contact surface of the substrate. However, the invention is not limited to the above construction. According to the invention, by using the rollers, the frictional force can be generally reduced to about 1/5 to 1/50.

Figure 12:
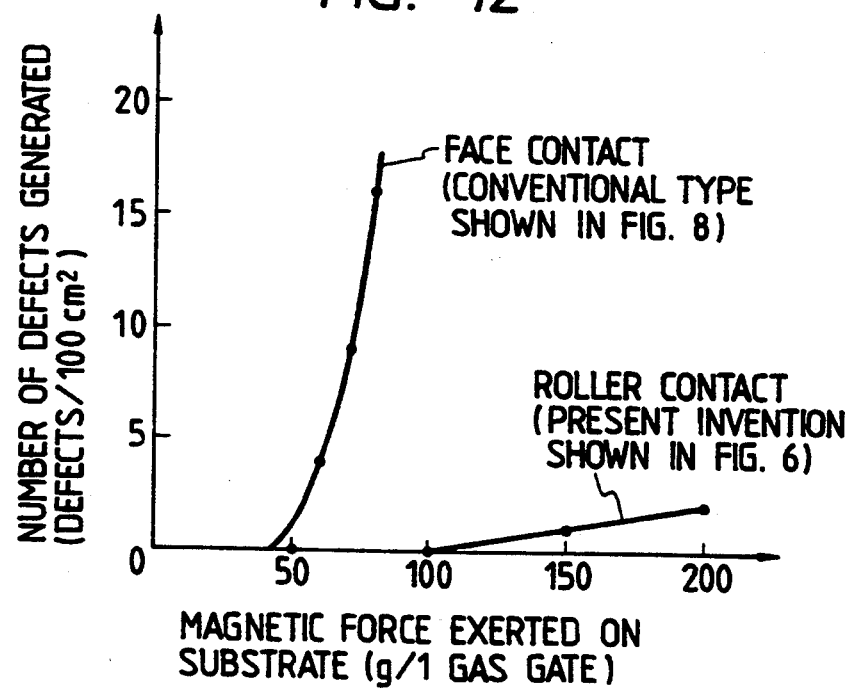
FIG. 12 is a graph showing the results of the measurement of the performance of the gas gate according to the invention and the performance of the conventional gas gate and also shows the relation between the magnetic force exerted on the substrate and the number of defects which occur.

FIG. 12 shows an example of the results of the measurement of the numbers of defects per 100 cm$^2$ of the solar battery which occur due to a short-circuit in the case where the magnetic force exerted on the substrate is changed in a manner similar to the case of FIG. 11 and the amorphous silicon solar battery of the PIN type is manufactured by the Roll to Roll method by using the gas gates of FIGS. 6 and 8. It has been confirmed from FIG. 12 that by using the rollers at the substrate contact surface, it becomes difficult to cause defects in the manufactured semiconductor device even when the substrate is adhered to the gas gates by the magnetic force in order to prevent the mixture of the gases.

In the case where the magnet is provided in the roller by fixing to the roller or the like, when the substrate is conveyed, the magnet in the roller rotates in association with the rotation of the roller, the magnetic force which is exerted between the roller and the substrate changes, so that the rotation of the roller is not performed smoothly. In the portion of the strong magnetic force, it becomes difficult to separate the roller and the substrate and they slide against each other, so that there is a case where the frictional force increases.

Figure 13:
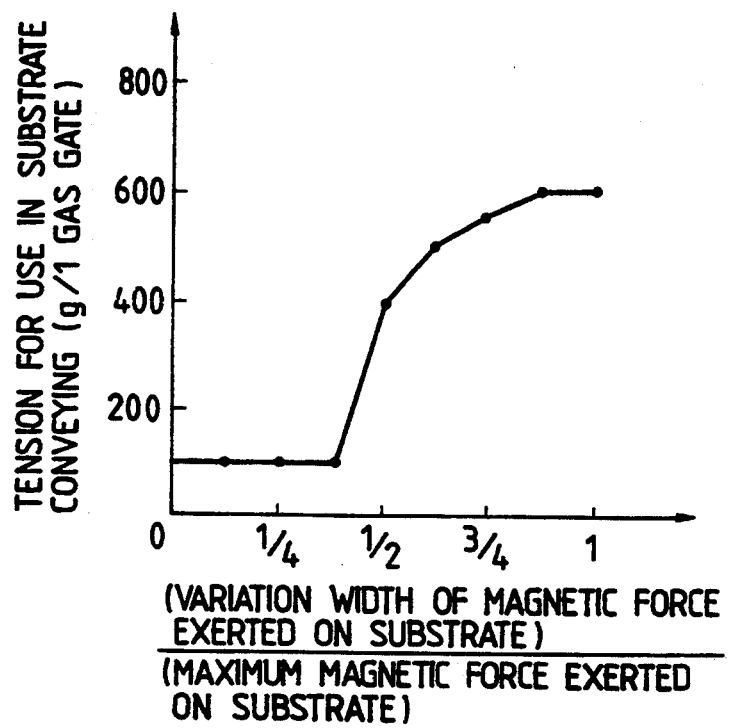
FIG. 13 is a graph showing the results of the measurement of the performance of the gas gate according to the invention and the performance of the conventional gas gate and also shows the relation between the ratio of (the variation width of the magnetic force exerted on the substrate)/(the maximum value of the magnetic force exerted on the substrate) and the tension which is required for conveyance of the substrate.

FIG. 13 shows an example of the results of the examination of the relation between the variation width of the magnetic force exerted on the substrate and the tension required for conveyance of the substrate in the case where the maximum value of the magnetic force which is exerted between the roller and the belt-shaped substrate as for the gas gate of FIG. 3 is set to the value just before the defects occur due to the slide when the fluctuation of the magnetic force is equal to 0. The maximum value of the magnetic force denotes the maximum value of the magnetic force which is exerted between the roller and the belt-shaped substrate when the roller is rotated once. The variation width denotes a difference between the maximum value and the minimum value of the magnetic force which is exerted between the roller and the belt-shaped substrate when the roller is rotated once. When the variation width of the magnetic force is equal to or larger than about ½ of the maximum magnetic force, a dragging friction occurs between the roller and the substrate and the tension which is required for conveyance of the substrate rapidly increases. Without limiting to the gas gate shown in FIG. 3, it is generally well known that when the variation width of the magnetic force is equal to or larger than ½ of the maximum magnetic force, the load due to the friction is significantly applied.

Figure 14:
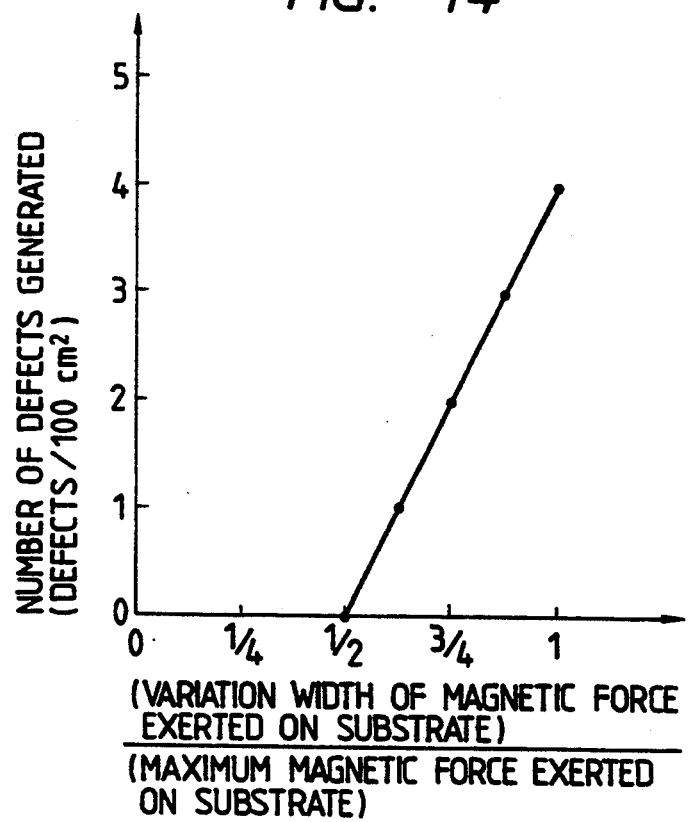
FIG. 14 is a graph showing the results of the measurement of the performance of the gas gate according to the invention and the performance of the conventional gas gate and also shows the relation between the ratio of (the variation width of the magnetic force exerted on the substrate)/(the maximum value of the magnetic force exerted on the substrate) and the number of defects which occur.

PIN type amorphous silicon solar batteries were manufactured by using the gas gates having different variation widths of the magnetic force and the numbers of defects per 100 cm$^2$ of the solar batteries which occurred due to a short-circuit were examined. The results of the measurement are shown in FIG. 14. When the variation width of the magnetic force is less than ½ of the maximum magnetic force, no defect occurs even when the substrate is fairly strongly adhered to the rollers. Such a point relates to one of the general characteristics in the construction of the invention.

As means for controlling the variation width of the magnetic force, a method of fixing the magnet to the fixing axis of the roller, a method of arranging the fixed magnet to the back side of the roller having a small diameter, or the like may be used. With such a method, the variation width can always be suppressed to a range of about 0 to ¼ of the maximum magnetic force.

EMBODIMENTS

The present invention will practically be described hereinbelow with respect to the embodiments. The invention, however, is not limited to only the embodiments.

Embodiment 1

A PIN type amorphous silicon solar battery was formed onto the belt-shaped substrate in the following manner by the manufacturing apparatus of the invention shown in FIG. 1.

The substrate 107 made by SUS430BA having a width of 30 cm, a length of 50 m, and a thickness of 0.2 mm was first set in such a manner that it was fed out from the supply chamber 104 and passed through three film forming chambers 101 to 103 and was wound in the take-up chamber 105. A slit width of gas gate connecting the film forming chambers was set to 5 mm, a length of slit was set to 40 cm, and a diameter of roller 112 made by SUS304 including a magnet therein was set to 3 cm (magnetic force was equal to 2000 Gauss).

Four rollers were projected from the wall surfaces of the slits by 1 mm. The magnet was fixed to the shaft of the roller as shown in FIG. 5 in such a manner that the magnetic force exerted on the substrate did not change even if the roller rotated.

After the inside of each film forming chamber was sufficiently exhausted by the exhaust pipe 110, the film forming gas was introduced into each film forming chamber via the gas introducing pipe 109 while successively exhausting. An exhaust quantity was adjusted while checking the pressure gauge 114, thereby adjusting the pressure in each film forming chamber to a predetermined pressure. An Ar gas of 200 sccm was introduced as a scavenging gas into the gas gate 106 from both of the upper and lower gas introducing pipes 113.

Figure 15:
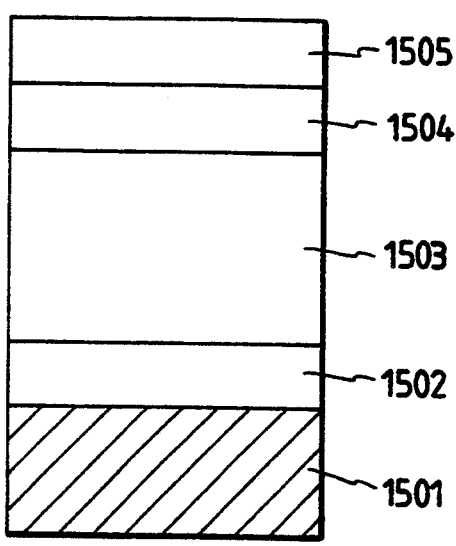
FIG. 15 is a schematic cross sectional view showing a construction of layers of a solar battery manufactured in embodiment 1 of the invention.

The belt-shaped substrate 107 was heated at a predetermined temperature by the heater 108 from the back side of the substrate. A high frequency electric power of 13.56 MHz was applied from the discharge electrode 111, thereby causing a glow discharge into each film forming chamber. The belt-shaped substrate was conveyed at a predetermined speed, thereby continuously forming amorphous silicon films of the N, I and P types onto the belt-shaped substrate. Table 1 shows the manufacturing conditions in each film forming chamber.

the following Table 2, thereby forming a solar battery shown in a schematic cross sectional view of FIG. 15. In FIG. 15, reference numeral 1501 denotes a substrate; 1502 an N type layer; 1503 an I type layer; 1504 a P type layer; and 1505 an ITO transparent conductive film.

TABLE 2

| Evaporation deposition source | Evaporation deposition atmosphere | Heating temperature of belt-shaped substrate (°C.) | Evaporation depositing rate (A/sec) | Thickness of evaporation deposited film (Å) |
| --- | --- | --- | --- | --- |
| In—Sn alloy (50:50) | $O_2$: $3 \times 10^{-4}$ Torr | 180 | 1 | 700 |

The resultant solar battery exhibited a good photoelectric converting efficiency which was almost equal to that of the solar battery manufactured by a deposited film forming apparatus of the 3-chamber separating type in which the film forming chambers were completely separated by gates. An impurity distribution in the direction of the film thickness was measured by using a secondary ion mass spectrometry (SIMS). Thus, it was confirmed that a mixture quantity of P atoms of the N layer into the I layer and a mixture quantity of B atoms of the P layer into the I layer were equal to or less than $1/10^5$ of the Si quantity and that the film forming gases in the adjacent film forming chambers were preferably separated by the gas gate.

When the belt-shaped substrate was taken out from the Roll to Roll type apparatus, no slide scratch was found on the film deposition surface and back surface of the belt-shaped substrate. Any defect by the slide scratch was not found on the manufactured solar battery.

Further, although the conveying system of the substrate was never performed during the film formation of the belt-shaped substrate of 50 m, no stretching and wrinkling occurred in the belt-shaped substrate and no defect of the device due to the peel-off of the deposited film was found.

Comparison Example 1

A PIN type amorphous silicon solar battery was formed on the belt-shaped substrate in a manner similar to the embodiment 1 except that gas gates were re-

TABLE 1

| Film forming chamber | Layer thickness of deposited film (Å) | Gas flow rate (sccm) | Pressure (Torr) | High frequency electric power (W) | Heating temperature (°C.) | Depositing speed (A/sec) |
| --- | --- | --- | --- | --- | --- | --- |
| 101 | N type amorphous silicon (200) | $SiH_4$ 50<br>$H_2$ 200<br>$PH_3/H_2$ 20 (5%) | 1.0 | 50 | 300 | 2 |
| 102 | I type amorphous silicon (4000) | $SiH_4$ 500<br>$H_2$ 1500 | 1.0 | 1000 | 300 | 20 |
| 103 | P type amorphous silicon (100) | $SiH_4$ 25<br>$H_2$ 100<br>$BF_3/H_2$ 15 (5%) | 1.0 | 25 | 250 | 1 |

The belt-shaped substrate, on which the amorphous silicon films derived by the above method by using the apparatus of the invention were deposited, was taken out from the Roll to Roll type apparatus and was cut out so as to have a size of 10 cm×10 cm. The cut-out substrates was put into a vacuum evaporation depositing apparatus of a single chamber. ITO transparent conductive films were laminated by a vacuum evaporation depositing method under the conditions shown in placed to the conventional type shown in FIG. 8. A slit width of gas gate was set to 4 mm. A distance between the surface of the belt-shaped substrate and the wall surface of the gas gate on the upper surface side was set to a value which was equal to that in embodiment 1. Ceramics of the alumina system were used as the low friction material of the gas gate wall 803 which comes into contact with the belt-shaped substrate. The magnetic force exerted on the substrate was also adjusted to the same value as that in embodiment 1.

The resultant solar battery exhibited a good photoelectric converting efficiency similar to that of the solar battery manufactured by the deposited film forming apparatus of the 3-chamber separating type in which the film forming chambers were completely separated by gates with respect to the portion having no defect. An impurity distribution in the direction of the film thickness was measured by using the secondary ion mass spectrometry (SIMS). Thus, it was confirmed that a mixture quantity of P atoms of the N layer into the I layer and a mixture quantity of B atoms of the P layer into the I layer were equal to or less than $1/10^5$ of the Si quantity and that the film forming gases in the adjacent film forming chambers were preferably separated by the gas gate.

However, although no scratch was found out on the film surface of the belt-shaped substrate taken out from the Roll to Roll type apparatus, many slide scratches appeared on the back surface of the substrate. As an average value, there were two defects per 100 cm$^2$ of the solar battery manufactured due to a short-circuit of the upper and lower electrodes. The number of solar batteries whose photoelectric converting efficiencies were less than 80% of that of an excellent solar battery reaches up to about 30% of the number of whole solar batteries.

Embodiment 2

Amorphous silicon layers of the N, I and P types were continuously formed onto the belt-shaped substrate in the following manner by using the apparatus according to the invention shown in FIG. 2.

First, a bent-shaped stainless substrate having a width of 30 cm, a length of 100 m, and a thickness of 0.15 mm and whose surface was polished to a mirror surface was set in a manner such that it is fed out from the supply chamber 204 and passed through nine film forming chambers 201, 202, 203, 208, 209, 210, 211, 212 and 213 connected by gas introducing pipe 206 and was wound in the take-up chamber 205. A slit width of each gas gate connecting the film forming chambers was set to 5 mm. A length of slit portion is set to 40 cm. No magnet was inserted in each of the four rollers made of stainless steel each having a diameter of 3 cm. The surface of each roller was projected from the gas gate wall by 1 mm. An Ar gas of 200 sccm was introduced as a scavenging gas into each gas gate from the upper and lower gas introducing pipes 206.

By allowing the belt-shaped substrate to pass through three sets of PIN film forming chambers 201 to 203, 208 to 210, and 211 to 213, three sets of amorphous silicon films of the N, I and P types were continuously formed onto the belt-shaped substrate under the conditions shown in the following Table 3. Finally, the belt-shaped substrate was wound like a roll in the take-up chamber 205.

TABLE 3

| Film forming chamber | Layer thickness of deposited film (Å) | Gas flow rate (sccm) | Pressure (Torr) | High frequency electric power (W) | Heating temperature (°C.) | Depositing speed (Å/sec) |
| --- | --- | --- | --- | --- | --- | --- |
| 201 | N type amorphous silicon (200) | SiH$_4$ 50<br>H$_2$ 200<br>PH$_3$/H$_2$ 20 (5%) | 1.0 | 50 | 300 | 2 |
| 202 | I type amorphous silicon germanium (3000) | Si$_2$H$_6$ 150<br>GeH$_4$ 100<br>H$_2$ 1000 | 1.05 | 1000 | 300 | 20 |
| 203 | P type amorphous silicon (100) | SiH$_4$ 50<br>H$_2$ 200<br>BF$_3$/H$_2$ 30 (5%) | 1.0 | 25 | 250 | 2 |
| 208 | N type amorphous silicon (100) | SiH$_4$ 50<br>H$_2$ 200<br>PH$_3$/H$_2$ 20 (5%) | 1.0 | 50 | 250 | 2 |
| 209 | I type amorphous silicon (3000) | SiH$_4$ 400<br>H$_2$ 1000 | 1.05 | 1000 | 250 | 20 |
| 210 | P type amorphous silicon (100) | SiH$_4$ 50<br>H$_2$ 200<br>BF$_3$/H$_2$ 30 (5%) | 1.0 | 25 | 250 | 2 |
| 211 | N type amorphous silicon (100) | SiH$_4$ 50<br>H$_2$ 200<br>PH$_3$/H$_2$ 20 (5%) | 1.0 | 50 | 250 | 2 |
| 212 | I type amorphous silicon (700) | SiH$_4$ 400<br>H$_2$ 1000 | 1.05 | 1000 | 250 | 20 |
| 213 | P type amorphous silicon (100) | SiH$_4$ 50<br>H$_2$ 200<br>BF$_3$/H$_2$ 30 (5%) | 1.0 | 25 | 200 | 2 |

Figure 16:
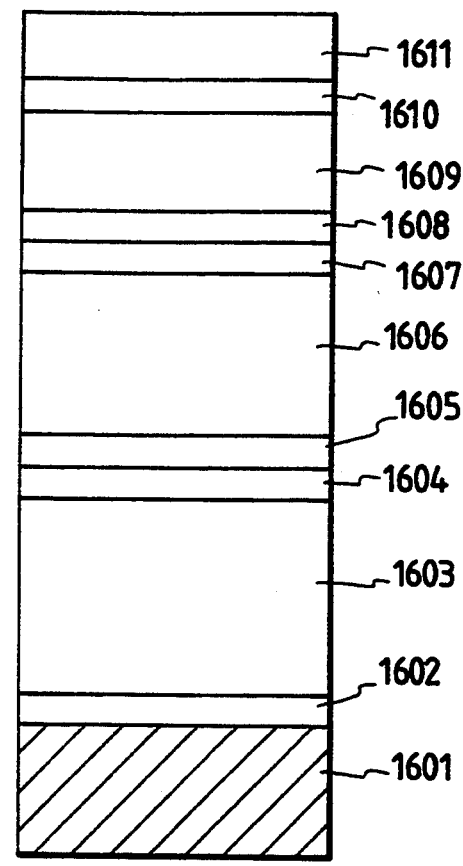
FIG. 16 is a schematic cross sectional view showing a construction of layers of a solar battery manufactured in embodiment 2 of the invention.

The belt-shaped substrate constructed by laminating the deposited films of nine layers as mentioned above was taken out from the Roll to Roll type apparatus and an ITO transparent conductive film was evaporation deposited in a manner similar to embodiment 1. The substrate was cut out so as to have a size of 10 cm × 10 cm, thereby forming a solar battery having a layer construction shown in a schematic cross sectional view of FIG. 16. In FIG. 16, reference numeral 1601 denotes a substrate; 1602, 1605 and 1608 indicate N type layers; 1603, 1606 and 1609 I type layers; 1604, 1607 and 1610 P type layers; and 1611 an ITO transparent conductive film.

The resultant solar battery exhibited a good photoelectric converting efficiency similar to that of the solar battery manufactured by independently depositing the films in the respective film forming chambers by using the apparatus such that nine film forming chambers were completely separated by gates under the same manufacturing conditions as those in embodiment 1. An impurity distribution in the direction of the film thickness was measured by using the SIMS. Thus, it was confirmed that mixture quantities of P atoms of the N layer into the I layer and P layer and mixture quantities of B atoms of the P layer into the I layer and N layer were equal to or less than $1/10^5$ of the Si quantity and the film forming gases in the adjacent film forming chambers were preferably separated by the gas gate.

No side scratch was found on the film deposited surface and back surface of the belt-shaped substrate taken out from the Roll to Roll type apparatus and no defect by the slide scratch was found in the manufactured solar battery.

Further, the conveying system of the substrate was never adjusted during the film formation of the belt-shaped substrate of 100 m. However, no stretching and wrinkling occurred in the belt-shaped substrate and no defect of the device by the peel-off of the deposited film was not found.

Embodiment 3

A solar battery as shown in FIG. 15 was manufactured by the manufacturing apparatus of FIG. 1 in a manner similar to embodiment 1 except that a polyimide film having a thickness of 0.1 mm was used as a belt-shaped substrate.

The resultant solar battery exhibited a good photoelectric converting efficiency similar to that of the solar battery manufactured by the deposited film forming apparatus of the 3-chamber separating type in which the film forming chambers were completely separated by the gates. An impurity distribution in the film thickness direction was measured by using the SIMS. Thus, it was confirmed that none of the P atoms of the N layer and the B atoms of the P layer was mixed into the I layer and that the film forming gases in the adjacent film forming chambers were perfectly separated by the gas gate.

No slide scratch was found on the film deposited surface and back surface of the belt-shaped substrate taken out from the Roll to Roll type apparatus and no defect by the scratch was found in the manufactured solar battery.

Further, although the conveying system of the substrate was never adjusted during the film formation of the belt-shaped substrate of 50 m, none of the stretching and wrinkling occurred in the belt-shaped substrate and no defect of the device due to the peel-off of the deposited film was found.

What is claimed is:

1. A method for continuously manufacturing a semiconductor device in a plurality of glow discharge regions on a belt-shaped substrate of magnetic material, comprising the steps of:

connecting a plurality of the glow discharge regions via a gas gate and arranging the belt-shaped substrate of magnetic material along a path sequentially penetrating the glow discharge regions;

supporting a substrate on a plurality of rotatable rollers, disposed into slit-shaped separating passages of the gas gates, by a magnetic force so as to support the back side of the belt-shaped substrate while rotating the rollers, and continuously conveying the belt-shaped substrate in a longitudinal direction;

varying a width of the magnetic field exerted between the rollers and the belt-shaped substrate upon conveyance of the belt-shaped substrate to a value which is equal to or less than ½ of a maximum value of the magnetic force.

2. A method according to claim 1, wherein a groove is formed on the roller.

3. A method according to claim 1, further comprising a glow discharge region constituting a semiconductor species of a first conductivity type, such that, a region constituting a semiconductor of a i conductivity type, and a region constituting a semiconductor of a second conductivity type opposite to the first one are sequentially provided.

4. A method according to claim 1, further comprising a glow discharge region constituting a semiconductor species of a first conductivity type, such that, a region constituting a second semiconductor of i-conductivity type, a region constituting a third semiconductor of a second conductivity type opposite to the first one, a region of a fourth semiconductor of the first conductivity type, a region constituting fifth semiconductor of i-conductivity type, and a region of sixth semiconductor of the second conductivity type are provided sequentially.

5. A method according to claim 1, further comprising a glow discharge region constituting a semiconductor species of a first conductivity type, such that, a region constituting a second semiconductor of i-conductivity type, a region of a third semiconductor of a second conductivity type opposite to the first conductivity type, a region constituting a fourth semiconductor of the first conductivity type, a region of a fifth semiconductor of i-conductivity type, a region constituting a sixth semiconductor of the second conductivity type, a region constituting a seventh semiconductor of the first conductivity type, a region constituting the i-conductivity type, and a region of ninth semiconductor of the second conductivity type are provided sequentially.

6. A method according to claim 1, wherein said step for varying the width of the magnetic force exerted between the rollers and the belt-shaped substrate to the value equal to or less than ½ of the maximum value of the magnetic force is performed by fixing a magnet at a fixing axis of the roller.

7. A method according to claim 1, wherein said step for varying the width of the magnetic force exerted between the rollers and the belt-shaped substrate to the value equal to or less than ½ of the maximum value of the magnetic force is performed by arranging a magnet at a back side surface of a fixed roller of the smaller diameter.

* * * * *

UNITED STATES PATENT AND TRADEMARK OFFICE
CERTIFICATE OF CORRECTION

PATENT NO. : 5,382,531
DATED : January 17, 1995
INVENTOR(S) : YASUSHI FUJIOKA, ET AL.

Page 1 of 3

It is certified that error appears in the above-identified patent and that said Letters Patent is hereby corrected as shown below:

ON TITLE PAGE

In [57] ABSTRACT:

Line 3, "An enough" should read --A sufficiently--.
Line 9, "which is needed" should read --desired--.

COLUMN 3

Line 32, "line B—B∝" should read --line B—B'--.

COLUMN 5

Line 49, "gas" should read --a gas--.

COLUMN 6

Line 47, "min." should read --mm.--.
Line 56, "invention," should read --invention--.
Line 66, "be also" should read --also be--.

COLUMN 8

Line 19, "strate" should read --strate,-- and
"FIG. 3" should read --FIG. 3,--.

COLUMN 9

Line 65, "substrates" should read --substrate--.

UNITED STATES PATENT AND TRADEMARK OFFICE
CERTIFICATE OF CORRECTION

PATENT NO. : 5,382,531
DATED : January 17, 1995
INVENTOR(S) : YASUSHI FUJIOKA, ET AL.

It is certified that error appears in the above-identified patent and that said Letters Patent is hereby corrected as shown below:

COLUMN 10

Line 43, "the" should be deleted and "gas" should read --the gas--.

COLUMN 12

Line 6, "is" should read --was--.
Line 8, "213" should read --213,--.
Line 12, "is" should read --was--.

COLUMN 13

Line 34, "not" should be deleted.

COLUMN 14

Line 12, "direction;" should read --direction; and--.
Line 22, "that," should read --that--.
Line 23, "a i" should read --an i--.
Line 29, "that," should read --that--.
Line 35, "fifth" should read --a fifth--.
Line 41, "that," should read --that--.
Line 51, "constituting" should read --constituting an eighth semiconductor of--.

UNITED STATES PATENT AND TRADEMARK OFFICE
CERTIFICATE OF CORRECTION

PATENT NO. : 5,382,531
DATED : January 17, 1995
INVENTOR(S) : YASUSHI FUJIOKA, ET AL.

It is certified that error appears in the above-identified patent and that said Letters Patent is hereby corrected as shown below:

COLUMN 14

Line 52, "ninth" should read --a ninth--.

Signed and Sealed this

Second Day of May, 1995

BRUCE LEHMAN

Attest:

Attesting Officer    Commissioner of Patents and Trademarks